Figure 1:
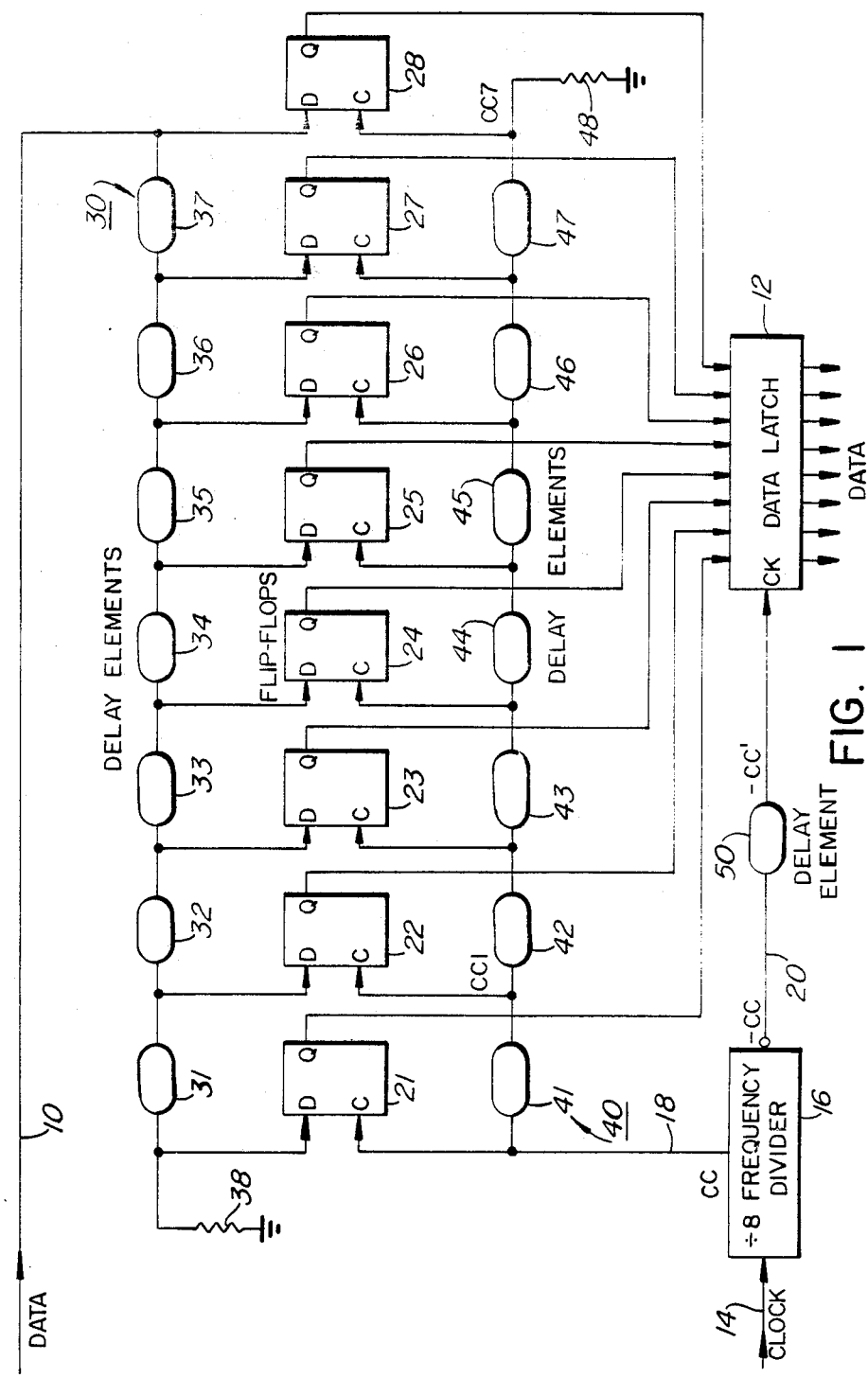

United States Patent [19]

Carlton

[11] Patent Number: 4,620,180
[45] Date of Patent: Oct. 28, 1986

[54] SERIAL-TO-PARALLEL CONVERTER FOR HIGH-SPEED BIT STREAMS

[75] Inventor: Stephen C. Carlton, Edmonton, Canada

[73] Assignee: Northern Telecom Limited, Montreal, Canada

[21] Appl. No.: 789,543

[22] Filed: Oct. 21, 1985

[51] Int. Cl.⁴ ......................................... H03K 13/256
[52] U.S. Cl. .............................. 340/347 DD; 377/64; 377/76; 328/56
[58] Field of Search ................. 340/347 SH, 347 DD; 377/64, 76; 328/56, 151

[56] References Cited

U.S. PATENT DOCUMENTS 3,955,191  5/1976  Lambourn ............... 340/347 AD X
4,443,766  4/1984  Belton, Jr. ........................ 328/56 X

OTHER PUBLICATIONS

The Engineering Staff of Analog Devices, Inc., Analog-Digital Conversion Handbook, 6/1972, pp. I-8 & II-112 to II-115.
Landee et al, Electronic Designers' Handbook, McGraw-Hill Book Co., Inc., 1957, pp. 20-2 to 20-5.
"Clock Recovery for a 5 Gbit/s Fibre-Optic System", by R. Bentland et al., Electronics Letters, Jun. 24th 1982, vol. 18, No. 13.

Primary Examiner—T. J. Sloyan
Attorney, Agent, or Firm—R. John Haley

[57] ABSTRACT

A serial bit stream and a clock signal at a frequency equal to the bit rate divided by an integer n are passed in opposite directions via respective delay lines to respectively the data and clock inputs of n flip-flops, which thereby each latch a respective one of n bits of the bit stream during n/2 bit periods. During the next n/2 bit periods the outputs of the flip-flops are stable, and the n bits are latched in a parallel data latch. The delay lines comprise transmission lines terminated with their effective characteristic impedances. The converter is particularly useful for bit rates greater than 1Gb/s.

11 Claims, 4 Drawing Figures

SERIAL-TO-PARALLEL CONVERTER FOR HIGH-SPEED BIT STREAMS

This invention relates to serial-to-parallel converters, and is particularly concerned with such a converter for accommodating high-speed serial bit streams, having predetermined bit rates of for example more than 1Gb/s (Gigabits per second).

It is well known to provide a serial-to-parallel converter comprising a plurality of data latches which are connected in sequence to form a shift register, to which a serial bit stream and a clock signal of corresponding frequency are applied, and a parallel data latch for latching bits in parallel from the individual latches of the shift register. Each data latch of the shift register typically comprises a D-type flip-flop, and the parallel data latch can comprise a plurality of such flip-flops.

Whilst such a serial-to-parallel converter is effective and practical for many applications, several problems arise when it is necessary to accommodate serial bit streams having very high bit rates, for example greater than 1Gb/s. Such high bit rates occur in high speed transmission systems, such as high speed optical fiber transmission systems. Three of these problems are outlined below.

Firstly, the shift register relies for its operation on the duration of each data bit being greater than the propagation delay through each latch, or stage, of the shift register. For a bit rate in excess of 1Gb/s, the bit duration is less than 1ns (nanosecond), which is less than the typical propagation delay through a shift register stage so that the shift register will not operate properly.

Secondly, the shift register clock line is coupled to the clock inputs of all of the shift register latches. For example there may be 8 latches with each clock input having a typical capacitance of 5pF, giving a total capacitance of 40pF. It is very difficult to drive such a capacitance whilst maintaining the rapid signal rise times which are required at a clock frequency of more than 1GHz.

Thirdly, the parallel data to be latched by the parallel data latch is only stable at the outputs of the shift register for one bit period. In consequence, this parallel data latch must meet extremely fast set-up and hold time requirements.

Whilst it is likely that data latches and shift registers with smaller propagation delays and input capacitances and faster set-up and hold times will eventually become available, it is equally likely that transmission speeds will increase so that these problems will remain and possibly become of even greater significance.

Accordingly, an object of this invention is to provide an improved serial-to-parallel converter, in which the problems outlined above are reduced or eliminated.

According to this invention there is provided a serial-to-parallel converter comprising: a plurality n of data latches each having a clock input, a data input, and a data output; first and second delay lines coupled respectively to the data inputs and the clock inputs of the data latches; means for supplying a serial bit stream having a predetermined bit rate N to one end of the first delay line and a clock signal having a frequency N/n to an opposite end of the second delay line; and means for deriving parallel bits from the data outputs of the data latches; the delay lines comprising delay elements providing delays such that the total delay provided by the two delay lines between the data inputs and the clock inputs of any two adjacent latches is 1/N, and the total delay provided in each delay line between the respective inputs of alternate data latches is 1/N.

Thus in accordance with the invention the serial bits are latched in data latches at times determined by delays provided by the delay lines for both the serial bit stream and a relatively reduced-frequency clock signal, these being supplied to the data latches in opposite directions via the delay lines. In consequence, the input capacitances of the data latches are distributed along the delay lines, so that signal rise times are not severely degraded, and the parallel data bits at the outputs of the data latches are stable for a greater period of about n/2 bit periods. Thus whilst data latches with fast set-up and hold times are required to latch bits at a high bit rate, a slower latch can be used to latch the parallel data from the fast data latch outputs.

Conveniently each delay line comprises n-1 delay elements coupled in series between the respective inputs of the data latches, each delay element of each delay line preferably providing a delay of ½N, all of the delay elements thereby providing the same delay of half a bit period.

Alternatively, each delay line may comprise alternately a delay element, providing a delay of 1/N, and a direct connection (i.e. a connection providing negligible delay) between the respective inputs of adjacent data latches.

The converter is desirably used for serial bit streams having bit rates N greater than 1Gb/s, in which case each delay element provides a delay of less than 500ps (picoseconds) in the former case or less than 1ns (nanosecond) in the latter case. In either case each delay line preferably comprises a transmission line terminated with its effective characteristic impedance.

Figure 2:
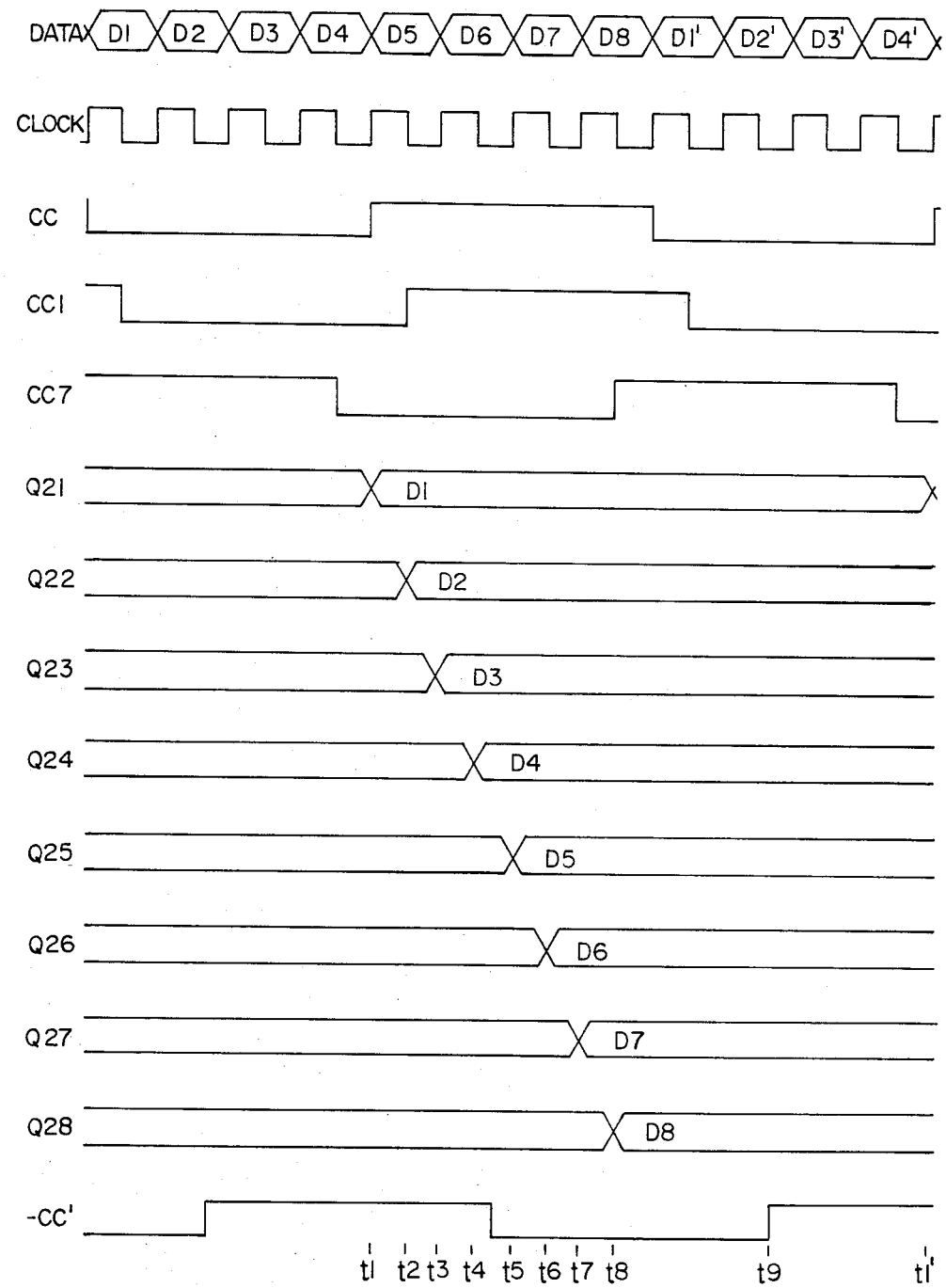
Figure 3:
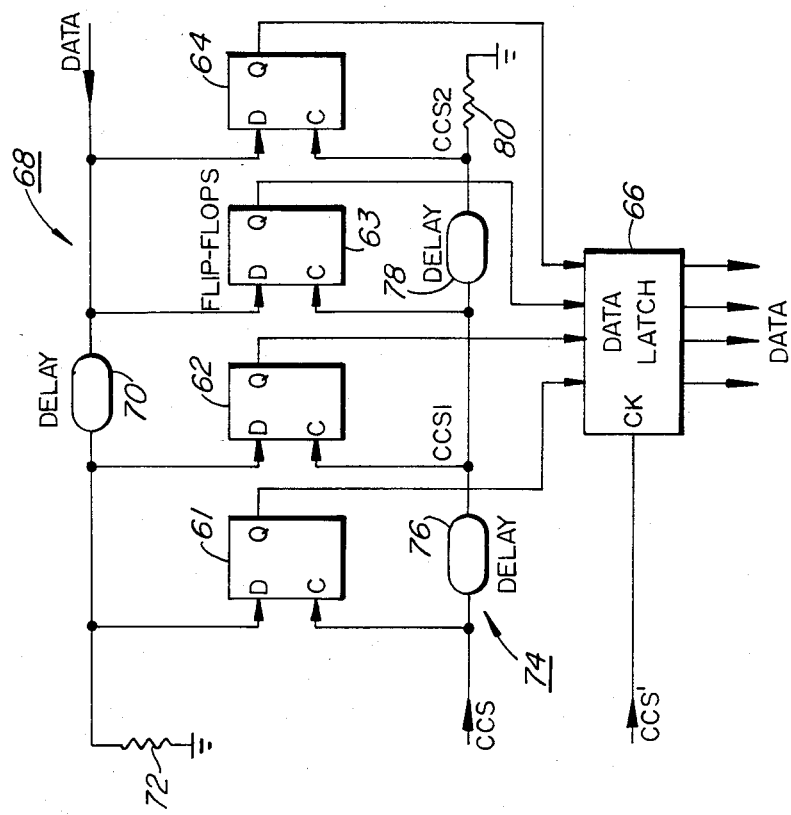
Figure 4:
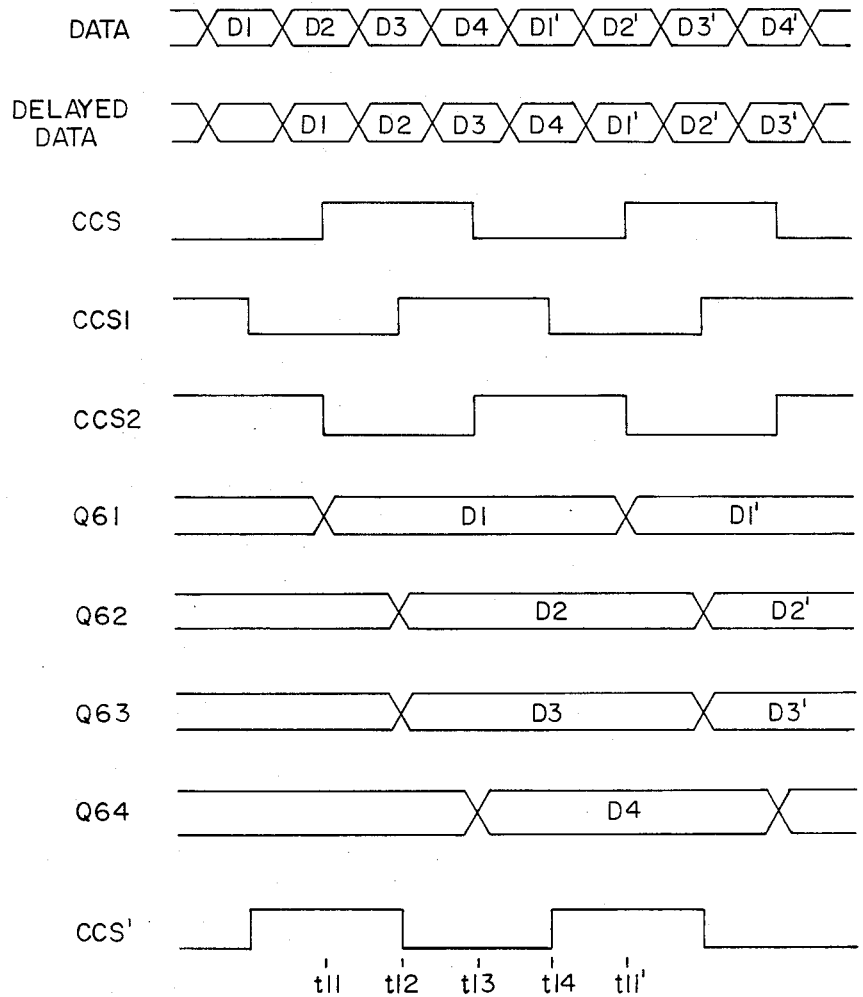

The invention will be further understood from the following description with reference to the accompanying drawings, in which:

FIG. 1 schematically illustrates a serial-to-parallel converter in accordance with the invention;

FIG. 2 shows signals illustrating the operation of the converter of FIG. 1;

FIG. 3 schematically illustrates an alternative form of serial-to-parallel converter in accordance with the invention; and FIG. 4 shows signals illustrating the operation of the converter of FIG. 3.

Referring to FIG. 1, there is illustrated a serial-to-parallel converter for converting serial data incoming on a line 10 into 8-bit parallel data outgoing from an 8-bit wide data latch 12. The converter is intended to convert serial data incoming at a predetermined bit rate, which is assumed here for example to be 1.228Gb/s, which bit rate determines the delay provided by delay elements in the converter as described below. An incoming clock signal CLOCK at a frequency of 1.228GHz, corresponding to this predetermined bit rate, on a line 14 is frequency divided in a frequency divider 16 by a factor equal to the number of parallel bit stages of the converter, in this case 8, to produce a converter clock signal CC on a line 18 and its complement −CC on a line 20.

The converter itself comprises 8 data latches constituted by D-type flip-flops 21 to 28 each having a data input D, a clock input C, and a data output Q and two delay lines 30 and 40 each comprising 7 delay elements 31 to 37 and 41 to 47 respectively. The delay elements of the delay line 30 are connected in series between the data inputs D of adjacent flip-flops; thus for example the delay element 31 is connected between the data inputs D of the adjacent flip-flops 21 and 22, and the delay element 32 is connected between the data inputs D of the adjacent flip-flops 22 and 23. Similarly, the delay elements of the delay line 40 are connected in series between the clock inputs C of adjacent flip-flops; thus for example the delay element 41 is connected between the clock inputs C of the adjacent flip-flops 21 and 22. The data outputs Q of the flip-flops 21 to 28 are connected to respective inputs of the data latch 12.

The serial data line 10 and the converter clock signal CC line 18 are connected to opposite ends of the delay lines 30 and 40 respectively. Thus as illustrated the line 10 is connected to the delay element 37 and the data input D of the flip-flop 28, and the line 18 is connected to the delay element 41 and the clock input C of the flip-flop 21. Each of the delay elements 31 to 37 and 41 to 47 provides a delay of half a bit period of the serial data signal on the line 10, i.e. 407ps at the bit rate of 1.228Gb/s. The delay elements 31 to 37 and 41 to 47 are for example sections of transmission lines, such as stripline, constituting the delay lines 30 and 40 respectively, which are terminated at their far ends with their effective characteristic impedances, represented by impedances 38 and 48 respectively, in order to eliminate reflections in known manner.

It will thus be seen that the serial data signal on the line 10 is applied without delay to the flip-flop 28, and with increasing integral multiples of a half-bit period delay to the flip-flops 27 to 21, whereas the converter clock signal CC on the line 18 is applied without delay to the flip-flop 21, and with increasing multiples of a half-bit period delay to the flip-flops 22 to 28. In consequence, eight consecutive bits of the serial data signal are latched in the flip-flops 21 to 28 respectively in less than four bit periods of the serial data signal, and the corresponding bits at the outputs Q of the flip-flops remain stable for a subsequent four bit periods of the serial data signal, during which time they are latched in the data latch 12 by a signal $-CC'$ which is applied to a clock input CK of the data latch 12. The signal $-CC$ is delayed in a delay element 50 by one and three-quarter bit periods, or 1.43ns in this example, to produce the signal $-CC'$.

This will be further understood from the following description with reference to FIG. 2, which illustrates the signals DATA (on the line 10), CLOCK, CC, and $-CC'$. FIG. 2 also illustrates delayed signals CC1 and CC7 produced at the output sides of the delay elements 41 and 47 respectively by delaying the signal CC; similar but differently delayed signals are produced at the output sides of the delay elements 42 to 46. In addition, FIG. 2 shows signals Q21 to Q28 which are produced at the outputs Q of the flip-flops 21 to 28 respectively.

The serial data on the line 10 is shown in FIG. 2 as comprising bits D1 to D8, D1' to D4'. . . , each bit having an arbitrary binary value. At a time t1, which is four bit periods after the start of the bit D1 on the line 10, and hence is when the mid-point of the bit D1 is present at the data input D of the flip-flop 21, the signal CC rises to latch this bit into this flip-flop, as shown by the signal Q21. Half a bit period later, at a time t2, the signal CC1 rises to latch the bit D2 into the flip-flop 22 as shown by the signal Q22, the mid-point of the bit D2 being present at the data input D of the flip-flip 22 at this time. Correspondingly, the data bits D3 to D8 are latched into the flip-flops 23 to 28 respectively at times t3 to t8 respectively, as shown by the signals Q23 to Q28 respectively.

Thus the data bits D1 to D8 are latched in the flip-flops 21 to 28 respectively during the period from the time t1 to the time t, and the outputs of the flip-flops are stable until this cycle starts to repeat, for the data bits D1' to D4' and so on, at a time t1'. In the middle of this stable period from the time t8 to the time t1', at a time t9, the signal $-CC'$ rises to latch the data bits D1 to D8 in parallel into the data latch 12. Thus the data latch 12 can be a relatively slow latch, in comparison to the data latches or flip-flops 21 to 28 each of which must latch a data bit having a bit period of 814ps. For example, the flip-flops 21 to 28 can be Fairchild type 11C06 data latches.

From the above description it should be appreciated that the flip-flops 21 to 28 are clocked at the frequency of the converter clock signal CC, i.e. 153.5MHz, rather than 1.228GHz, and the data bits are not shifted through these flip-flops in the manner of a shift register so that only the set-up and hold times, and not the propagation delays, of these flip-flops are significant. Furthermore, the input capcitances of the flip-flops are distributed along the delay lines 30 and 40, so that neither the signal CC nor the data has to drive a relatively high lumped capacitance of these inputs. The distributed input capacitances have the effect of reducing the effective characteristic impedance of the transmission line which constitutes the delay line, and can be accommodated by appropriate selection of the impedance 38 or 48.

The invention is not limited to the particular embodiment described above, and numerous changes may be made for example in the number of stages and hence the number of parallel bits obtained from the parallel data latch, the manner in which the signals CC and $-CC'$ are derived, the relative ends of the delay lines to which the lines 10 and 18 are connected, and the particular bit rates and frequencies which are used.

In this respect it should be observed with reference to FIG. 2 that, although as described the times t2, t4, t6 and t8 occur half a bit period after the respective times t1, t3, t5, and t7, the operation of the converter is not significantly adversely affected if this half bit period interval is decreased to zero or increased to one bit period. It follows from this that it is not essential for all of the delay elements in the delay lines 30 and 40 to provide the same delay of half a bit period. On the contrary, it is only necessary that the total delay provided in the two delay lines between the data inputs and the clock inputs of any two adjacent latches or flip-flops is 1/N or one bit period, e.g. that the sum of the delays provided by the delay elements 32 and 42 between the inputs of the adjacent flip-flops 22 and 23 be one bit period, and that the total delay provided in each delay line between the respective inputs of alternate data latches or flip-flops is also 1/N or one bit period, e.g. that the sum of the delays provided by the delay elements 32 and 33 between the data inputs D of the alternate flip-flops 22 and 24 be one bit period, and likewise the sum of the delays provided by the delay elements 42 and 43 be one bit period. With these constraints, the delay provided by any individual delay element can be anywhere from zero to one bit period.

FIG. 3 shows another serial-to-parallel converter in which this is illustrated, and FIG. 4 shows a corresponding signal diagram. The converter shown in FIG. 3 has only four flip-flops 61 to 64, correspondingly a 4-bit-wide parallel data latch 66, a delay line 68, comprising a single delay element 70, to which serial data is applied and which is terminated with its effective characteristic impedance 72, and a delay line 74, comprising two delay elements 76 and 78, to which a converter clock signal CCS is applied and which is terminated with its effective characteristic impedance 80. Each of the delay elements 70, 76, and 80 provides a delay of one bit period, and the delay lines 68 and 74 comprise alternately a delay element, providing the one bit period delay, and a direct connection between respective flip-flop inputs, providing a negligible or substantially zero delay. Thus as illustrated the data inputs D of the flip-flops 61 and 62 are directly interconnected, the data inputs D of the flip-flops 63 and 64 are directly interconnected, and the clock inputs C of the flip-flops 62 and 63 are directly interconnected. As in the converter of FIG. 1, the data and the signal CCS are supplied to opposite ends of the delay lines 68 and 74, and the Q outputs of the flip-flops 61 to 64 are connected to the inputs of the parallel data latch 66, which in this case is clocked by a signal CCS'.

FIG. 4 shows the incoming serial data, comprising serial bits D1 to D4, D1' to D4', and so on, which is applied to the delay line 68 and hence to the data inputs D of the flip-flops 63 and 64, and the delayed data, delayed by one bit period by the delay element 70, which is applied to the data inputs D of the flip-flops 61 and 62. Similarly, FIG. 4 shows the signal CCS which is applied to the clock input C of the flip-flop 61 and to the delay line 74, a signal CCS1, produced by delaying the signal CCS for one bit period in the delay element 76, which signal is applied to the clock inputs C of the flip-flops 62 and 63, and a signal CCS2 which is applied to the clock input C of the flip-flop 64 and which is produced by delaying the signal CCS1 for one bit period in the delay element 78. FIG. 4 also shows signals Q61 to Q64 representing the data bits latched in the flip-flops 61 to 64 respectively and appearing at their outputs Q, and the clock signal CCS' for the parallel data latch 66.

As illustrated in FIG. 4, the data bits D1 and D1' are latched in the flip-flop 61 at times t11 and t11' when the signal CCS rises. One bit period after the time t11, at a time t12, the signal CCS1 rises to latch the data bit D3 in the flip-flop 63 and to latch the delayed data bit D2 in the flip-flop 62. A further bit period later, at a time t13, the signal CCS2 rises to latch the data bit D4 in the flip-flop 64. The data at the outputs Q of the flip-flops is stable during the two bit periods between the times t13 and t11', in the middle of which at a time t14 the signal CCS' rises to latch the parallel data bits in the latch 66.

Numerous other modifications, variations, and adaptations may be made without departing from the scope of the invention, which is defined in the claims.

What is claimed is:

1. A serial-to-parallel converter comprising:
   a plurality n of data latches each having a clock input, a data input, and a data output;
   first and second delay lines coupled respectively to the data nputs and the clock inputs of the data latches;
   means for supplying a serial bit stream having a predetermined bit rate N to one end of the first delay line and a clock signal having a frequency N/n to an opposite end of the second delay line; and
   means for deriving parallel bits from the data outputs of the data latches;
   the delay lines comprising delay elements providing delays such that the total delay provided by the two delay lines between the data inputs and the clock inputs of any two aqjacent latches is 1/N, and the total delay provided in each delay line between the respective inputs of the atternate data latches is 1/N.

2. A converter as claimed in claim 1 wherein each delay line comprises n-1 delay elements coupled in series between the respective inputs of the data latches.

3. A converter as claimed in claim 2 wherein each delay element of each delay line provides a delay of ½N.

4. A converter as claimed in claim 3 wherein each delay element provides a delay of less than 500ps, the predetermined bit rate N being greater than 1Gb/s.

5. A converter as claimed in claim 1 wherein each delay line comprises alternately a delay element, providing a delay of 1/N, and a direct connection between the respective inputs of adjacent data latches.

6. A converter as claimed in claim 5 wherein each delay element provides a delay of less than 1ns.

7. A converter as claimed in claim 1 wherein each delay line comprises a transmission line terminated with its effective characteristic impedance.

8. A converter as claimed in claim 1 wherein each data latch comprises a D-type flip-flop.

9. A converter as claimed in claim 1 and including a further data latch, having n data inputs coupled to the data outputs of said data latches, for latching the parallel bits once in each cycle of the clock signal.

10. A converter as claimed in claim 1 and including a frequency divider for producing the clock signal oy frequency divison by a factor of n of a further clock signal having a frequency N.

11. A converter as claimed in claim 1 wherein n is an integral power of 2.

* * * * *